Oct. 8, 1963 I. LUIK 3,106,684

AMPLIFIER WITH INTERRUPTED POSITIVE FEEDBACK

Filed July 15, 1960

INVENTOR.
ILMAR LUIK
BY Moody and Phillips
ATTORNEYS

United States Patent Office 3,106,684

Patented Oct. 8, 1963

3,106,684

AMPLIFIER WITH INTERRUPTED POSITIVE FEEDBACK

Ilmar Luik, Cedar Rapids, Iowa, assignor to Collins Radio Company, Cedar Rapids, Iowa, a corporation of Iowa Filed July 15, 1960, Ser. No. 43,079
6 Claims. (Cl. 328—142)

This invention relates generally to a positive feedback amplifier system, more particularly to a positive feedback amplifier system which is easy to de-energize after cessation of the input signal.

Amplifiers employing positive feedback are, of course, old in the art. This is equally true of A.C. amplifiers, as well as D.C. amplifiers. In the case of such amplifiers one of the difficulties encountered has been that once the amplifier has become saturated, the signal fed back from the output terminals to the input terminals will maintain saturation of the amplifier even after the original input signal has terminated. In other words, in an amplifier employing the positive feedback means there is difficulty in turning off the amplifier once it has become energized.

An object of the invention is to provide an amplifying system employing a positive feedback in which the amplifier will become de-energized shortly after cessation of the input signal.

A further object of the invention is the improvement of positive feedback amplifiers generally.

In accordance with the invention there is provided in combination with an amplifier a feedback means which supplies at least a portion of the output signal back to the input terminals of the amplifier. The feedback signal being polarized in such a manner as to aid the input signal. The positive feedback means comprises an interrupting means for periodically opening the feedback circuit, thus insuring that the amplifier will become de-energized at such time, in the event that the input signal has terminated. A diode means of the zener type is connected in series with the interrupting means in the feedback circuit to provide a threshold voltage so that the noise and low-level signals will be prevented from causing saturation of the amplifier.

In accordance with a feature of the invention a second diode means may be connected between the load circuit of the amplifier and the feedback circuit so as to prevent any capacitance in the load circuit from discharging back through the feedback circuit to re-initiate operation and resultant saturation of the amplifier circuit.

Figure 1:
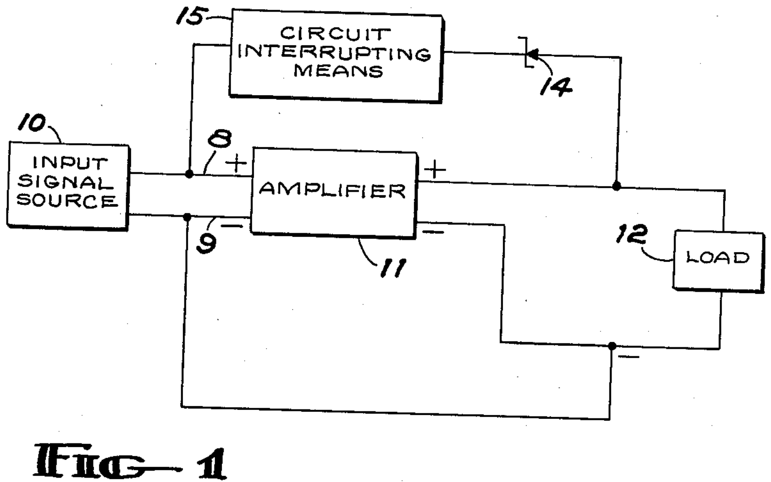
Figure 2:
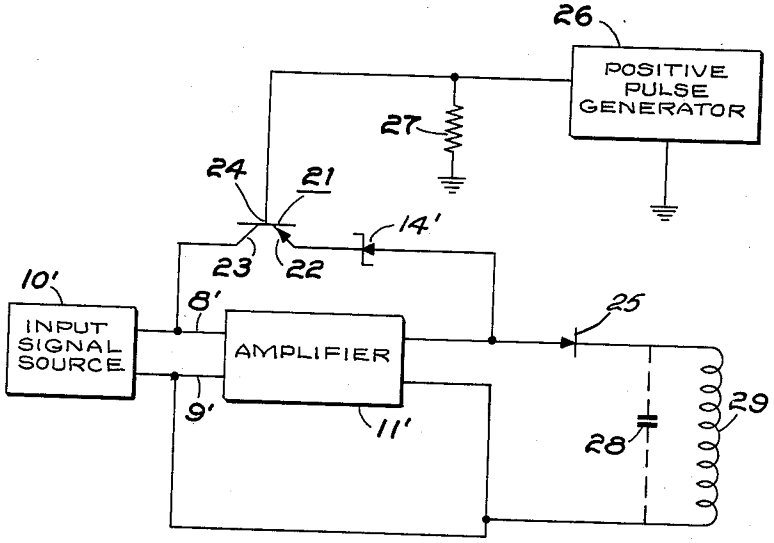

The above-mentioned and other objects and features of the invention will be more fully understood from the following detailed description thereof when read in conjunction with the drawing in which FIG. 1 shows a block diagram of a general form of the invention; and FIG. 2 shows a combination block diagram and schematic sketch of a specific form of the invention.

In FIG. 1 an input signal source 10 is constructed to supply its output signal to the amplifier 11. The output signal of the amplifier is supplied to the load 12 and also is fed back to the input terminals 8 and 9 through the feedback circuit comprising zener diode 14 and circuit interrupting means 15. The function of the zener diode is to establish a certain minimum of threshold voltage below which the positive feedback circuit will not supply a voltage back to the input of the amplifier 11.

It is a characteristic of a zener type diode that it will present a high impedance to a voltage applied thereacross until such voltage reaches a certain value, at which value the zener diode will "break down" and will thereafter for all voltages exceeding said given voltage present a relatively low impedance. Thus, the potential at which said breakdown occurs is the threshold voltage herein mentioned. Such a threshold voltage is necessary in order to prevent noise, or some other undesirable low-level signal, from initiating operating of the amplifier into saturation.

In the operation of the circuit the input signal from source 10 is amplified by amplifier 11 and when the difference between the output voltage of amplifier 11 and the input signal thereto is greater than the breakdown voltage of the zener diode 14, the said zener diode will break down and permit the positive feedback circuit to supply signal back to the input terminals 8 and 9. Saturation of the amplifier will occur rapidly, the specific saturation time depending upon the particular RC time constants inherent in the circuit. In the absence of interrupter circuit 15, once saturation of amplifier 11 has occurred, it will remain saturated even though the signal from the input signal source 10 terminates. The aforementioned continued saturation of the amplifier 11 will continue since the signal fed back through the positive feedback circuit takes the place of the terminated input signal. The only condition for maintaining saturation of amplifier 11 is that the gain of the loop including the amplifier 11 and the positive feedback circuit be greater than unity.

In many applications it is undesirable that the saturation of amplifier 11 be continued after termination of a signal from the input signal source 10. To provide for de-energization of the amplifier 11, the positive feedback circuit is opened at periodic intervals by means of circuit interrupting means 15. It will be apparent that the maximum time that the saturation of the amplifier 11 can continue after termination of the input signal from source 10 is equal to the time interval between interruptions of the feedback circuit means. Thus, if the feedback circuit were interrupted every 100 milliseconds, the maximum time that could occur between termination of the input signal and de-saturation of amplifier 11, disregarding any time delays caused by RC combinations, would be 100 milliseconds.

There are many circuit means which can be employed to interrupt the positive feedback circuit. For example, a relay operated by a source of periodic pulses could be employed. Alternatively, an electron valve such as a vacuum tube or a transistor operating in conjunction with a source of periodic pulses, could be employed to interrupt the positive feedback circuit at desired intervals of time. In FIG. 2, for example, there is shown a specific circuit which can be employed to interrupt the positive feedback circuit. Such specific circuit comprises transistor 21 which includes an emitter electrode 22, a collector electrode 23, and a base electrode 24. The interrupting circuit also includes a positive pulse generator 26 having a load resistor 27. In the absence of a positive pulse from the generator 26 the transistor 21 will become conductive when the difference voltage between the output and input signals of the amplifier 11′ becomes large enough to break down the zener diode 14′. At this time the transistor 21 will function as a low impedance and permit free flow of the output signal of the amplifier back to the input terminals; thus driving the amplifier 11 rapidly into a state of saturation. However, since the transistor 21 is a PNP type transistor, the positive pulses from the generator 26 will function to cause the transistor 21 to become non-conductive substantially for the duration of each of said positive pulses. Thus, the feedback circuit is opened periodically and if the input signal from the source 10′ is terminated at this time the time of any such interruption, the amplifier 11 will be caused to become de-energized and the output voltage thereof will go to zero. The zener diode 14′ will then again present a high impedance to the output terminals of amplifier 11′ and will function to prevent any undesirable low-level signal or noise signal from reactivating the amplifier 11′. Only upon the application of a signal of proper strength to the input terminals 8′ and 9′ of the amplifier 11′ will the output signal of the amplifier 11′ become sufficiently great to again break down the zener diode 14′ and again enable the positive feedback circuit to cause saturation of the amplifier 11′. A second diode 25 is connected between amplifier 11′ and a load consisting of a coil 29 and capacitance 28.

Although most applications of the present invention would probably be used in connection with D.C. amplifiers and D.C. input signals, it is also applicable for use in connection with A.C. amplifiers and A.C. input signals. In the latter case the first positive going cycle of the A.C. input signal of sufficient magnitude would result in a breakdown of the zener diode 14 and would immediately result in positive feedback action to cause a saturation of the amplifier 11. The saturated condition of the amplifier 11 would continue through succeeding cycles of the input signal. Only upon the interruption of the feedback circuit would the amplifier 11 become de-saturated. If the A.C. input signal were still present, the amplifier would again become saturated at the first positive swing of the input signal.

It is to be noted that the forms of the invention herein shown and described are but preferred embodiments thereof and that various changes in circuit components employed and changes in circuit design may be made without departing from the spirit or scope of the invention.

I claim:

1. In combination with an amplifying means having input and output terminals and an input signal source, positive feedback circuit means connecting the output terminals of said amplifier to the input terminals of said amplifying means, said positive feedback means comprising the series arrangement of a zener diode means and a circuit interrupting means.

2. A combination in accordance with claim 1 wherein said circuit interrupting means comprises an electron valve having an electron emitting electrode and electron collecting electrode connected in series arrangement with said zener diode, means for causing said electron valve to be normally conductive when said zener diode is conductive, and means for periodically causing said electron valve to become non-conductive.

3. A combination in accordance with claim 2 in which said electron valve comprises a transistor including a base electrode, in which said last-mentioned means comprises a source of periodic pulses, and means for supplying said periodic pulses to said base electrode.

4. In combination with an amplifying means having input and output terminals and an input signal source, positive feedback circuit means constructed to supply at least a portion of the output signal of said amplifying means to the input of said amplifying means, said positive feedback means comprising the series arrangement of a circuit interrupting means and a second circuit means having the characteristic of a high impedance below a given threshold potential level and a low impedance above said given threshold potential level.

5. A combination in accordance with claim 4 wherein said circuit interrupting means comprises an electron valve having an electron emitting electrode and an electron collecting electrode connected in series arrangement with said second circuit means, means for causing said electron valve to be normally conductive when said second circuit means exhibits its low impedance, and means for periodically causing said electron valve to become non-conductive.

6. A combination in accordance with claim 5 in which said electron valve comprises a transistor including a base electrode, in which said last-mentioned means comprises a source of periodic pulses, and means for supplying said periodic pulses to said base electrode.

References Cited in the file of this patent

UNITED STATES PATENTS

| | | |
|---|---|---|
| 2,874,236 | Sikorra | Feb. 17, 1959 |
| 2,892,042 | Leypold | June 23, 1959 |
| 2,924,786 | Talkin | Feb. 9, 1960 |